United States Patent
Yoon et al.

(10) Patent No.: US 7,193,914 B2
(45) Date of Patent: Mar. 20, 2007

(54) OPEN DIGIT LINE ARRAY ARCHITECTURE FOR A MEMORY ARRAY

(75) Inventors: Sei Seung Yoon, San Diego, CA (US); Charles L. Ingalls, Meridian, ID (US); David Pinney, Boise, ID (US); Howard C. Kirsch, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/500,786

(22) Filed: Aug. 7, 2006

(65) Prior Publication Data

US 2006/0268638 A1 Nov. 30, 2006

Related U.S. Application Data

(62) Division of application No. 11/074,518, filed on Mar. 7, 2005.

(51) Int. Cl.
*G11C 7/00* (2006.01)
(52) U.S. Cl. .................. 365/205; 365/210; 365/230.03
(58) Field of Classification Search ................ 365/205, 365/210, 230.03
See application file for complete search history.

(56) References Cited

U.S. PATENT DOCUMENTS

| | | | |
|---|---|---|---|
| 5,608,668 A | 3/1997 | Zagar et al. | 365/149 |
| 5,761,109 A | 6/1998 | Takashima et al. | 365/63 |
| 6,043,562 A | 3/2000 | Keeth | 257/776 |
| 6,356,474 B1 | 3/2002 | Bissey et al. | 365/63 |
| 6,515,925 B2 | 2/2003 | Graham et al. | 365/205 |
| 6,535,439 B2* | 3/2003 | Cowles | 365/201 |
| 6,608,772 B2* | 8/2003 | Ooishi | 365/63 |
| 6,614,681 B2 | 9/2003 | Hidaka | 365/171 |
| 6,721,221 B2 | 4/2004 | Schreck | 365/208 |
| 6,735,103 B2 | 5/2004 | Kirsch | 365/51 |

OTHER PUBLICATIONS

Eto, S. et al., "A 1-Gb SDRAM with Ground-Level Precharged Bit Line and Nonboosted 2.1-V Word Line", IEEE Journal of Solid-State Circuits, vol. 33, No. 11, Nov. 1998. pp. 1697-1702.

* cited by examiner

*Primary Examiner*—Hoai V. Ho
(74) *Attorney, Agent, or Firm*—Dorsey & Whitney LLP

(57) ABSTRACT

A system and method for sensing a data state stored by a memory cell that includes coupling a first digit line and a second digit line to a precharge voltage and further coupling a memory cell to the first digit line. At least one digit line other than the first and second digit lines is driven to a reference voltage level and the at least one digit line is coupled to the second digit line to establish a reference voltage in the second digit line. A voltage differential is sensed between the first digit line and the second digit line, and a data state based on the voltage differential is latched in response.

15 Claims, 5 Drawing Sheets

OPEN DIGIT LINE ARRAY ARCHITECTURE FOR A MEMORY ARRAY

CROSS-REFERENCE TO RELATED APPLICATION

This application is a divisional of pending U.S. patent application No. 11/074,518, filed Mar. 7, 2005.

TECHNICAL FIELD

The invention relates generally to memory devices, and more specifically, to memory arrays employing an open digit line array architecture.

BACKGROUND OF THE INVENTION

Memory devices, such as dynamic random access memories ("DRAMs"), include one or more arrays of memory cells arranged in rows and columns. Each array may be divided into several sub-arrays. Typically, one or more digit or "bit" lines are provided for each column of the array, and each digit line is coupled to a respective sense amplifier. Each sense amplifier is generally a differential amplifier that compares the voltage at one of its inputs to the voltage at the other of its inputs. The sense amplifier then drives its inputs to complementary logic levels corresponding to the sensed differential voltage.

An array architecture that is commonly used in memory devices, such as DRAMs, is an "open digit line array" or "open array" architecture. In an open array architecture, a sense amplifier is coupled to the digit lines of two adjacent sub-arrays. Each of the digit lines is coupled to memory cells in the respective memory sub-array. Thus, each sense amplifier is shared by two sub-arrays so that one input to the sense amplifier is coupled to the digit line of one array and the other input to the sense amplifier is coupled to the digit line of the other array. Prior to a memory read operation, the digit lines are precharged to a voltage DVC/2 that is typically one-half a supply voltage.

During a read operation, a word line representing a row of memory cells is activated in the memory sub-array having the memory cell to be access. The activated word line coupled each memory cell of the row to a respective digit line. In response, the voltage on each digit line either increases or decreases from DVC/2 depending upon the logic level stored in the respective memory cell. The other digit line of each of the sense amplifiers remains at the precharge voltage DVC/2. Each sense amplifier detects that the voltage on the digit line coupled to the memory cell being accessed has either increased or decreased relative to the precharge voltage DVC/2 and then drives the respective digit lines to complimentary logic levels corresponding to the sensed voltage. The data latched by one of the sense amplifiers is then selected based on a column address for the desired memory cell.

In a modification to the sensing scheme previously described, the digit lines are precharged to ground rather than precharged to the DVC/2 voltage. The grounded digit line scheme is desirable for low voltage operating conditions because a DVC/2 voltage precharge is unsuitable with the threshold voltage of the sense amplifiers under the low voltage conditions. In low voltage conditions, the DVC/2 voltage is at a voltage level that barely switches on the transistors of the sense amplifiers, resulting in relatively slow sense times. The sensing operation for a grounded digit line scheme is similar to that for a DVC/2 precharge scheme, and has the advantage of being able to switch on p-channel transistors of the sense amplifiers quickly. Upon coupling a memory cell to one of the grounded digit lines, the other digit line of the sense amplifier is coupled to a reference voltage. Based on the voltage of the digit line coupled to the memory cell relative to the digit line coupled to the reference voltage, the sense amplifier drives the digit lines to complementary voltage levels and latches the data state of the memory cell. That is, the digit line coupled to the memory cell is driven to ground and the reference digit line is driven to a supply voltage by the sense amplifier in response to the digit line coupled to the memory cell having a lower voltage than the reference digit line. Conversely, the digit line coupled to the memory cell is driven to the supply voltage and the reference digit line is driven to ground by the sense amplifier in response to the digit line coupled to the memory cell having a higher voltage than the reference digit line.

A stable and reliable reference voltage is important for the functionality of a grounded digit line scheme. Variations in the reference voltage, in severe cases, can cause the sense amplifier to sense and latch incorrect data. For example, if the reference voltage shifts to a greater voltage due to process, voltage, or temperature ("PVT") variations, a condition exists where the digit line coupled to a memory cell can be forced to ground, although the digit line should have been driven to the supply voltage. The voltage of the digit line coupled to the memory cell would have been otherwise greater than the reference voltage if not for the shift in the reference voltage to a higher voltage. As a result, the sense amplifier senses and latches an incorrect data state. In lower voltage operating conditions, stability and reliability of the reference voltage is even more critical because the same absolute shifts in the reference voltage represent greater relative shifts with lower operating voltages.

Most semiconductor memory devices will be subject to PVT variations during fabrication and operation. Thus, the memory devices must be designed with sufficient PVT margin to operate correctly under these conditions. However, as lower operating voltages are used, designing a sense amplifier and precharge scheme having sufficient margin for correct operation becomes increasingly difficult. Therefore, there is a need for an alternative sense amplifier and precharge scheme that can provide a stable and reliable reference voltage despite PVT variations.

SUMMARY OF THE INVENTION

The present invention is directed to an open digit line array architecture that utilizes charge developed on driver digit lines to establish a reference voltage on reference digit lines. In one aspect of the invention, the open digit line array architecture includes a first sense amplifier coupled to a first pair of digit lines and a second sense amplifier coupled to second pair of digit lines. A first switch selectively couples a first digit line of the first pair of digit lines to a common reference line and a second switch selectively couples a first digit line of the second pair of digit lines to the common reference line. Control logic coupled to the first and second sense amplifiers and further coupled to the control nodes of the first and second switches controls the second sense amplifier to drive the first digit line of the second pair of digit lines to a voltage level and also generates control signals for the first and second switches to couple the first digit line of the first pair of digit lines to the first digit line of the second pair of digit lines.

In another aspect of the invention, a method for sensing a data state stored by a memory cell includes coupling a first digit line and a second digit line to a precharge voltage and further coupling the memory cell to the first digit line. At least one digit line other than the first and second digit lines is driven to a reference voltage level and the at least one digit line is coupled to the second digit line to establish a reference voltage in the second digit line. A voltage differential is sensed between the first digit line and the second digit line, and a data state based on the voltage differential is latched in response.

DETAILED DESCRIPTION OF PREFERRED EMBODIMENTS

Embodiments of the present invention are directed to circuits and methods for setting a reference voltage during a digit line precharge operation by sharing a voltage developed on at least one digit line with reference digit lines in an open digit line array architecture. Certain details are set forth below to provide a sufficient understanding of the invention. However, it will be clear to one skilled in the art that the invention may be practiced without these particular details. In other instances, well-known circuits, control signals, timing protocols, and software operations have not been shown in detail in order to avoid unnecessarily obscuring the invention.

Figure 1:
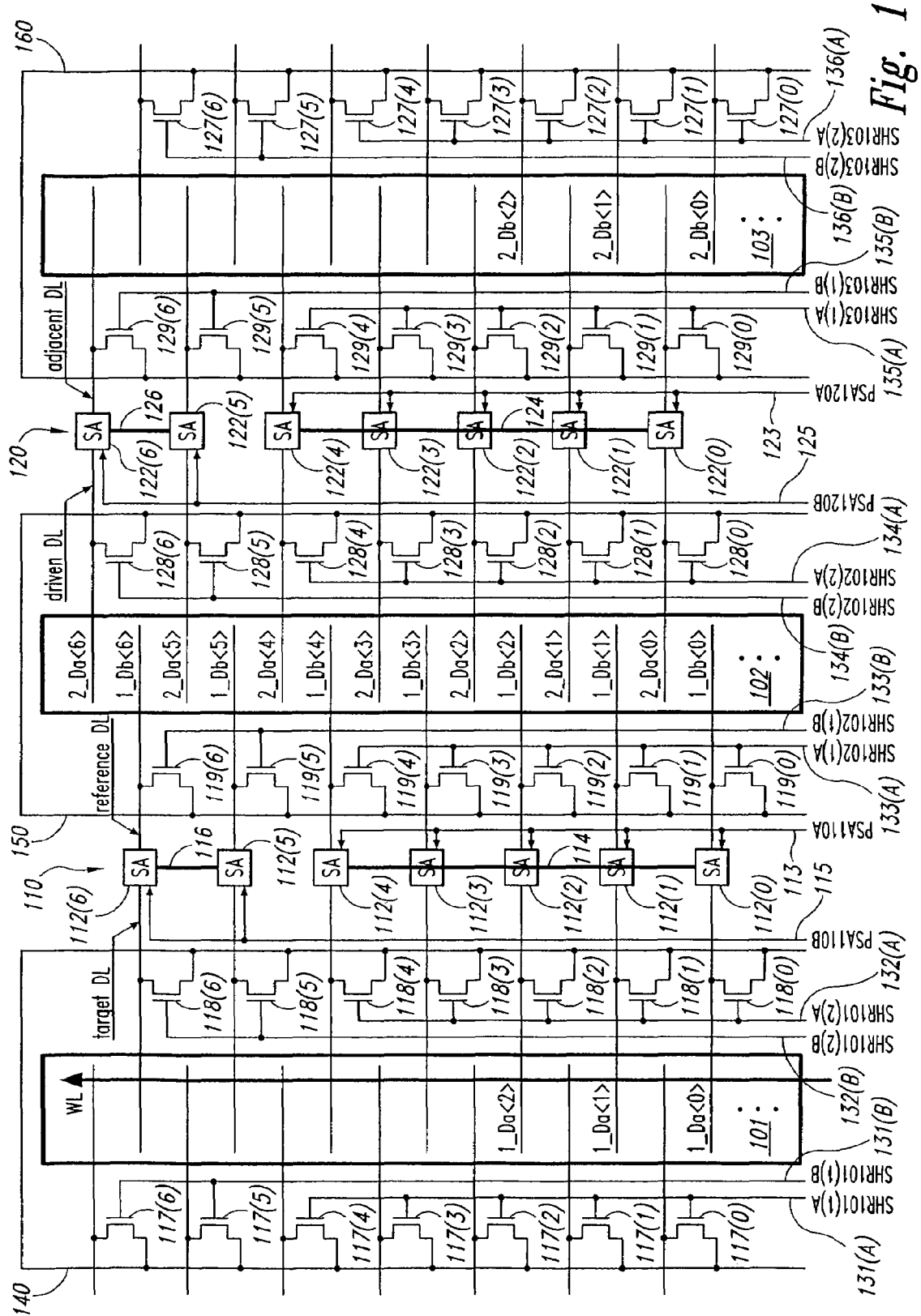
FIG. 1 is a functional block diagram of an open digit line array architecture according to an embodiment of the present invention.

FIG. 1 illustrates sense amplifiers according to an embodiment of the present invention. The sense amplifiers 100 have an open-array architecture and are shared by three memory sub-arrays 101, 102, 103. A first set of sense amplifiers 110 are shared by the memory sub-arrays 101 and 102, and a second set of sense amplifiers 120 are shared by the memory sub-arrays 102 and 103. Due to the open-array architecture, each sense amplifier of the first and second sets of sense amplifiers 110, 120 is coupled to a digit line from a first memory sub-array and is further coupled to a digit line from a second memory sub-array. As previously described, during a sense operation, one digit line of a sense amplifier is coupled to a memory cell of one memory sub-array while the other digit line is charged to a reference voltage. As shown in FIG. 1, the sense amplifiers of the first set of sense amplifiers 110 are coupled to digit lines of the memory sub-arrays 101 and 102, and the sense amplifiers of the second set of sense amplifiers 120 are coupled to digit lines of the memory sub-arrays 102 and 103.

The first and second sets of sense amplifiers 110, 120 are divided into sub-groups of sense amplifiers that are coupled to a common activation line ACT. For example, the first set of sense amplifiers 110 has a first sub-group of sense amplifiers that includes sense amplifiers 112(0)–112(4) coupled to an ACT 114 and further has a second sub-group of sense amplifiers that includes sense amplifiers 112(5) and 112(6) coupled to an ACT 116. The first sub-group of sense amplifiers 112(0)–112(4) are further commonly coupled to a voltage supply activation line 113 and the second sub-group of sense amplifiers 112(5) and 112(6) are coupled to a voltage supply line 115. Similarly, the second set of sense amplifiers 120 has a first sub-group of sense amplifiers 122(0)–122(4) coupled to an ACT 124 and a second sub-group of sense amplifiers 122(5) and 122(6) coupled to an ACT 126. The first and second sub-groups of sense amplifiers 122(0)–122(4) and 122(5) and 122(6), are coupled to respective voltage supply activation lines 123 and 125. As will be described in more detail below, the sense amplifiers that are coupled to a common ACT can be coupled to a supply voltage independently from the sense amplifiers coupled to another common ACT. The coupling of a group of sense amplifiers to the supply voltage is controlled by the respective voltage supply activation lines.

The digit lines of the memory sub-arrays 101, 102, 103 are further coupled to respective common reference lines 140, 150, 160. The digit lines of the memory sub-array 101 are coupled to the common reference line 140, the digit lines of the memory sub-array 102 are coupled to the common reference line 150, and the digit lines of the memory sub-array 103 are coupled to the common reference line 160. The digit lines of the memory sub-array 101 that are coupled to the first set of sense amplifiers 110 are coupled to the common reference line 140 through a set of switches 118(0)–118(6). The digit lines of the memory sub-array 101 that are coupled to a set of sense amplifiers not shown (off the page to the left of FIG. 1) are coupled to the common reference line 140 through a set of switches 117(0)–117(6). The digit lines of the memory sub-array 102 that are coupled to the first set of sense amplifiers 110 are coupled to the common reference line 150 through switches 119(0)–119(6) and the digit lines of the memory sub-array 102 that are coupled to the second set of sense amplifiers 120 are coupled to the common reference line 150 through switches 128(0)–128(6). The digit lines of the memory sub-array 103 that are coupled to the second set of sense amplifiers 120 are coupled to the common reference line 160 through switches 129(0)–129(6) and the digit lines of the memory sub-array 103 that are coupled to the other set of sense amplifiers not shown (off the page to the right of FIG. 1) are coupled to the common reference line 160 through switches 127(0)–127(6).

The sets of switches 117(0)–117(6), 118(0)–118(6), 119(0)–119(6), 127(0)–127(6), 128(0)–128(6), and 129(0)–129(6) are grouped into sub-groups that have gates which are coupled to a common activation line to provide selective coupling of the groups of digit lines to the respective common reference line. The grouping of the switches 117(0)–117(6), 118(0)–118(6), 119(0)–119(6), 127(0)–127(6), 128(0)–128(6), and 129(0)–129(6) correspond to the sub-groups of the sense amplifiers of the first and second sets of sense amplifiers 110, 120. For example, a common activation line 132(A) is coupled to the switches 118(0)–118(4) and a common activation line 132(B) is coupled to the switches 118(5) and 118(6). Similarly, a common activation line 133(A) is coupled to the switches 119(0)–119(4) and a common activation line 133(B) is coupled to the switches 119(5) and 119(6). The other groups of switches have similar sub-groupings having common activation lines.

As will be explained in more detail below, the common reference lines 140, 150, 160 are used to set a reference voltage for reference digit lines as part of a digit line precharge operation. More specifically, a group of digit lines coupled to one set of sense amplifiers are driven to a voltage supply voltage level and then coupled via a common activation line to reference digit lines which have been precharged to ground. The voltage developed on the digit lines driven to the voltage supply voltage level is shared with all of the reference digit lines when coupled to the common reference line to establish a reference voltage. The voltage level of the reference digit lines depends on the number of digit lines that are driven to the voltage supply voltage level and then coupled to the reference digit lines.

Figure 2:
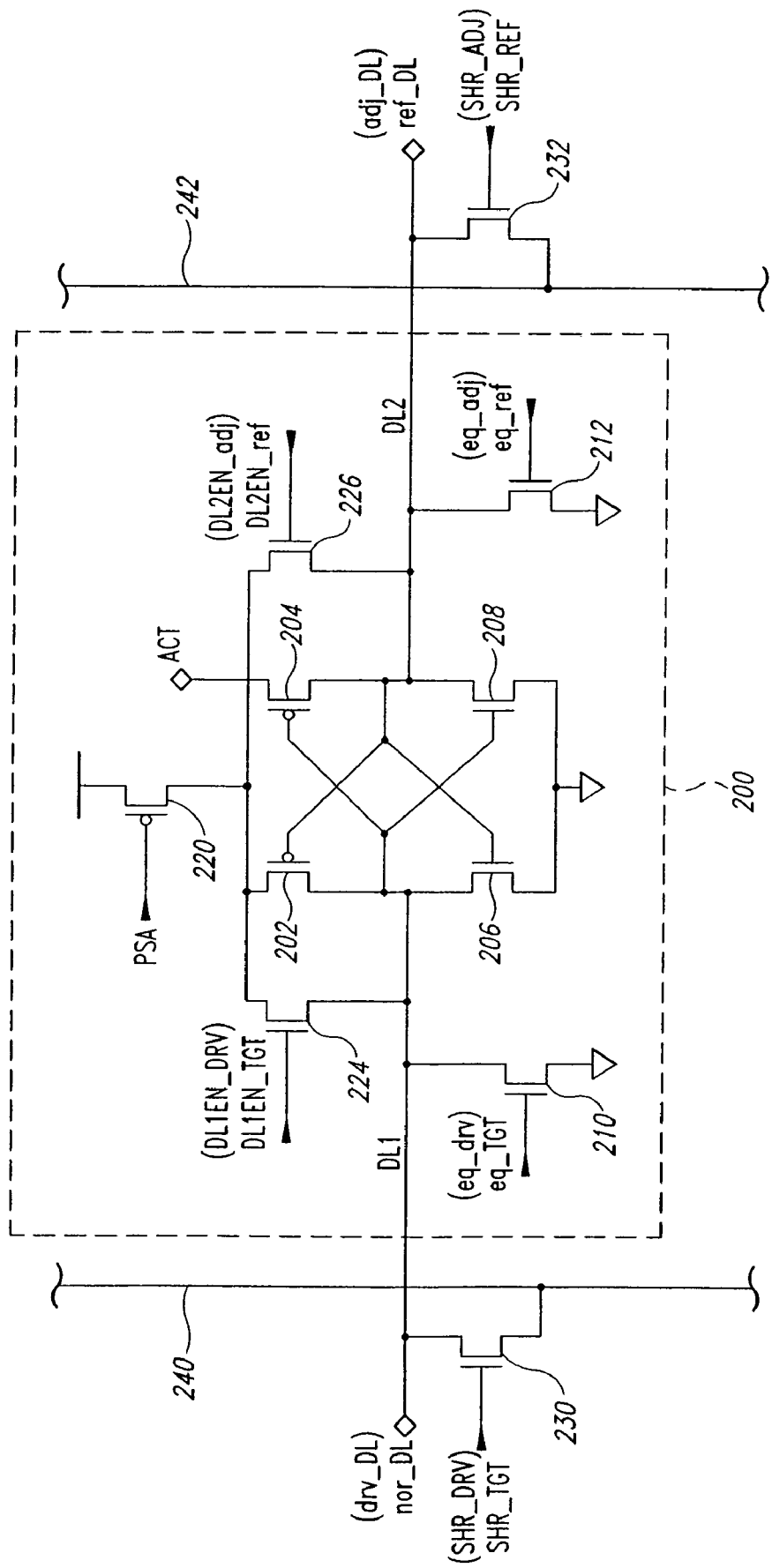
FIG. 2 is a schematic diagram of a sense amplifier for the open digit line array architecture of FIG. 1.

FIG. 2 illustrates a sense amplifier 200 coupled to digit lines DL1 and DL2 which can be substituted for the sense amplifiers 112(0)–112(6) and 122(0)–122(6). The sense amplifier 200 includes a latch having p-channel metal-oxide-semiconductor ("PMOS") transistors 202, 204 and n-channel metal-oxide-semiconductor ("NMOS") transistors 206, 208 for latching a data state applied to the first digit line DL1 or the second digit line DL2. The sense amplifier 200 further includes NMOS precharge transistors 210, 212 for coupling the digit lines DL1 and DL2, respectively, to ground during a digit line precharge operation. A PMOS transistor 220 couples sources of the PMOS transistors 202, 204 to a voltage supply when activated. By activating the PMOS transistor 220, a common activation line ACT is also coupled to the voltage supply. As previously discussed, groups of sense amplifiers are coupled to a common ACT line for independent activation. NMOS transistors 224, 226 are used with the PMOS transistor 220 to drive the digit lines DL1 and DL2 to the voltage supply voltage level. Driving the respective digit line to the voltage supply voltage level is part of the digit line precharge operation that sets a non-zero voltage level for reference digit lines. The digit line DL1 is coupled to a common reference line 240 through NMOS transistor 230 and the digit line DL2 is coupled to a common reference line 242 through NMOS transistor 232. The common reference lines 240, 242 correspond to the common reference lines 140, 150, 160 (FIG. 1) and the NMOS transistors 230, 232 correspond to the switches 117, 118, 119, 127, 128, 129.

Operation of the sense amplifiers 100 of FIG. 1 and the sense amplifier 200 of FIG. 2 will be described with respect to the timing diagram of FIG. 3. The operation will be described in the context of activating a word line WL in the memory sub-array 101. The various sets of digit lines will be referred to in the following manner. The digit lines coupled to the cells being accessed in the memory sub-array 101 are referred to as "target" digit lines, the digit lines of the memory sub-array 102 that are used as reference for the first set of sense amplifiers 110 are "reference" digit lines, the digit lines of the memory sub-array 102 that are coupled to the second set of sense amplifiers 120 and charged to a voltage supply voltage level to set a reference voltage on the reference digit lines are "driver" digit lines, and the digit lines of the memory sub-array 103 that are coupled to the second set of sense amplifiers 120 are "adjacent" digit lines.

The designation of the signals are shown in FIG. 2 for both the sense amplifier as coupled to the target and reference digit lines and the sense amplifier as coupled to the driver digit lines and the adjacent digit lines. The signal names shown in parenthesis represent the signals for the sense amplifier as coupled to the driver and adjacent digit lines, and the signal names without parenthesis represent the signals applied for the sense amplifier as coupled to the target and reference digit lines. For example, the NMOS transistor 210 has a gate to which an EQ_DRV signal or an EQ_TGT signal is applied. The EQ_DRV signal, shown in parenthesis, represents the signal applied to the NMOS transistor 210 for the sense amplifier if coupled to the driver and adjacent digit lines. The EQ_TGT signal, in contrast, represents the signal applied to the NMOS transistor 210 for the sense amplifier if coupled to the target and reference digit lines.

Figure 3:
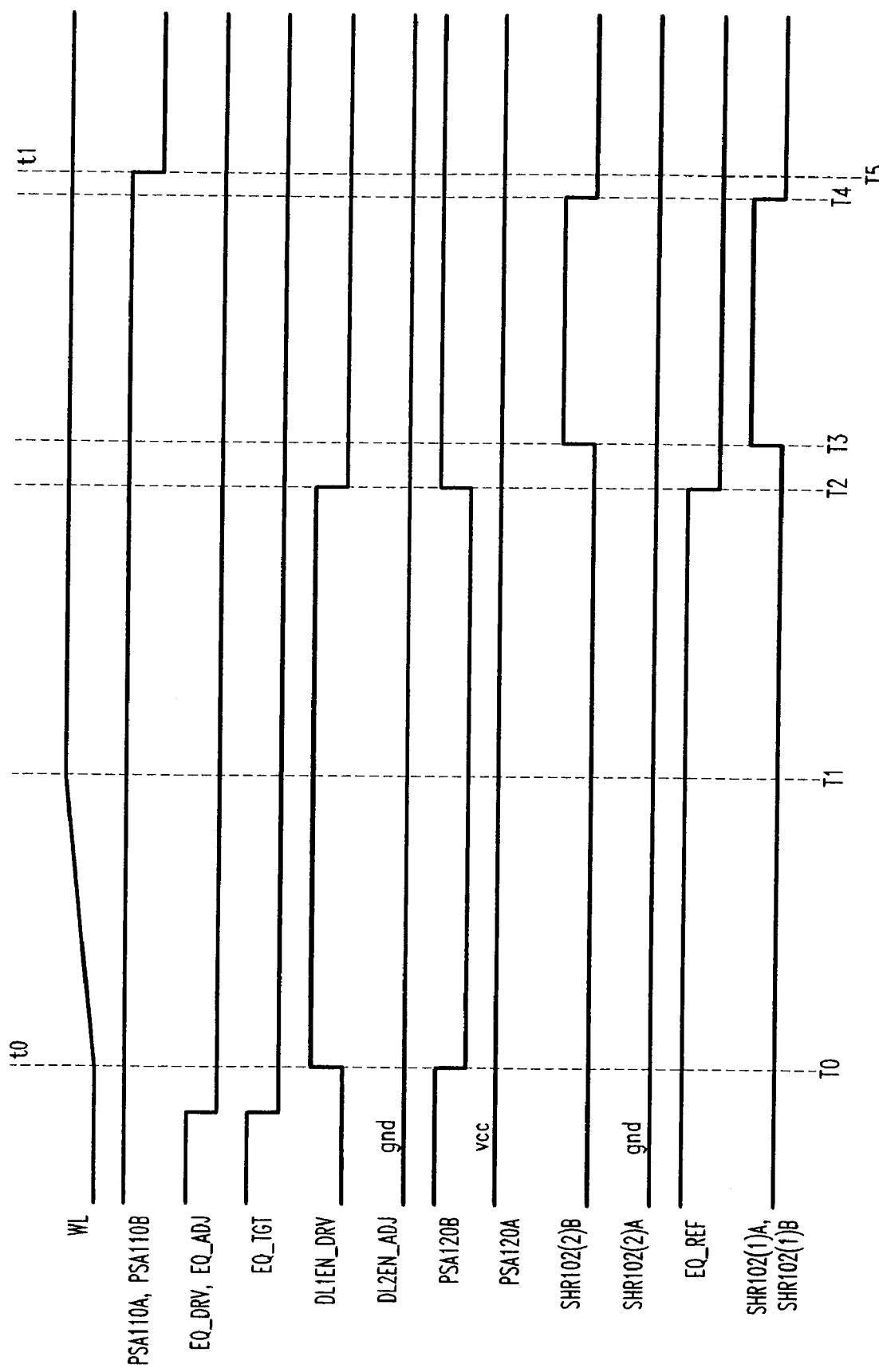
FIG. 3 is a timing diagram of various signals during the operation of the open digit line array of FIG. 1 and the sense amplifier of FIG. 2.

With reference to FIG. 3, at a time prior to T0, all of the digit lines are coupled to ground through respective precharge transistors 210, 212 as shown in FIG. 3 by equilibration signals EQ_DRV, EQ_ADJ, EQ_REF, and EQ_TGT for the driver, adjacent, reference and target digit lines, respectively. The EQ_DRV, EQ_ADJ, and EQ_TGT signals are then switched LOW to decouple the driver and adjacent digit lines and the target digit lines from ground. At a time T0, a word line WL in the memory sub-array 101 is activated to couple the memory cells of the activated row to a respective target digit line. Additionally, a voltage supply activation signal corresponding to PSA120B switches LOW to couple the sources of the PMOS transistors 202, 204 to the voltage supply through a respective PMOS transistor 220 of the sense amplifiers 122(5) and 122(6) of the second sub-group of sense amplifiers. A voltage supply activation signal corresponding to PSA120A remains HIGH thereby keeping the sense amplifiers 122(0)–122(4) of the first sub-group of sense amplifiers deactivated. The PSA120A and PSA120B signals correspond to the PSA signal shown in FIG. 2.

Also at the time T0, a driver digit line enable signal DL1EN_DRV goes HIGH to couple the driver digit lines coupled to the sense amplifiers 122(5) and 122(6) to the voltage supply. The driver digit lines behave as capacitors storing electrical charge in response to being coupled to the voltage supply. An adjacent digit line enable signal DL2EN_ADJ remains LOW to keep the NMOS transistor 226 of the sense amplifiers 122(5) and 122(6) decoupled from the voltage supply. As a result, the driver digit lines of the memory sub-array 102 that are coupled to the sense amplifiers 122(5) and 122(6) are driven to a voltage supply voltage level while the digit lines of the memory sub-array 103 coupled to the sense amplifiers 122(5) and 122(6) remain decoupled from the voltage supply.

At a time T1, the WL in the memory sub-array 101 is driven to a wordline voltage level to fully couple the memory cells of the row being accessed to a respective digit line of the memory sub-array 101. By the time T1, the voltage of the respective target digit lines have been set by the coupling of the memory cell. At a time T2, the DL1EN_DRV signal goes LOW and the PSA120B signal goes HIGH to decouple the driver digit lines of the memory sub-array 102 coupled to the sense amplifiers 122(5) and 122(6) from the voltage supply. The EQ_REF signal switches LOW at the time T2 as well, decoupling the reference digit lines of the memory sub-array 102 from ground. At a time T3, a digit line charge sharing signal SHR102(2)B goes HIGH to activate the switches 128(5) and 128(6), thus, coupling the driver digit lines of the memory sub-array 102 coupled to the sense amplifiers 122(5) and 122(6) to the common reference line 150. A digit line charge sharing signal SHR102(2)A maintains a LOW state at the time T3 to keep the digit lines coupled to the sense amplifiers 122(0)–122(4) from being coupled to the common reference line 150. The SHR102(2)A and SHR102(2)B signals correspond to the SHR_DRV signal shown in FIG. 2.

Digit line charge sharing signals SHR102(1)A and SHR102(1)B also switch HIGH at the time T3 to couple the reference digit lines of the memory sub-array 102 coupled to the first set of sense amplifiers 110 to the common reference line 150. The SHR102(1)A and SHR102(1)B signals correspond to the SHR_REF signal shown in FIG. 2. The two driver digit lines coupled to the sense amplifiers 122(5) and 122(6), as previously described, were driven to a voltage supply voltage level between the times T0 and T2 and behave as capacitors storing electrical charge. As a result, the electrical charge of the two driver digit lines coupled to the sense amplifiers 122(5) and 122(6) is distributed through the common reference line 150 to set a reference voltage for the reference digit lines of the memory sub-array 102 coupled to the first set of sense amplifiers 110.

At a time T4 the SHR102(2)B, SHR102(1)A, and SHR102(1)B signals return LOW to decouple the respective digit lines of the memory sub-array 102 from the common reference line 150. The time between the time T3 and the time T4 allows the distributed voltage to stabilize for the reference digit lines coupled to the first set of sense amplifiers 110 and the two driver digit lines coupled to the sense amplifiers 122(5) and 122(6). With the reference voltage set on the reference digit lines, voltage supply activation signals PSA110A and PAS110B switch LOW at a time T5 to couple the sources of the PMOS transistors of the sense amplifiers 112(0)–112(4) and the sense amplifiers 112(5) and 112(6), respectively, to the voltage supply to begin a sensing operation. The PSA110A and PSA110B signals correspond to the PSA signal shown in FIG. 2. The time T5 generally represents the end of the digit line precharge operation and the beginning of the sensing operation, during which the sense amplifiers 112(0)–112(6) latch a respective data state of the memory cells of the accessed row that are coupled to the respective target digit lines of the memory sub-array 101. The sense operation, which is not shown in the timing diagram of FIG. 3, is conventional and understood by those ordinarily skilled in the art.

In the previous example, the reference voltage of the reference digit lines of the memory sub-array 102 coupled to the first set of sense amplifiers 110 was set based on sharing the charge developed on the two driver digit lines of the memory sub-array 102 coupled to the sense amplifiers 122(5) and 122(6). As shown in FIG. 1, the reference voltage can be alternatively set by developing a charge on the five driver digit lines of the memory sub-array 102 coupled to the sense amplifiers 122(0)–122(4) and then sharing the developed charge with the target digit lines. This can be accomplished by switching the PSA120A signal LOW between the times T0 and T2 to couple the digit lines coupled to the sense amplifiers 122(0)–122(4) to be driven to the voltage supply voltage level and switching the SHR102(2)A signal HIGH between the times T3 and T4 to couple the driver digit lines coupled to the sense amplifiers 122(0)–122(4) to the common reference line 150. In contrast, the PSA120B signal was switched LOW between the times T0 and T2 and the SHR102(2)B signal was switched HIGH between the times T3 and T4 to set the reference voltage of the reference digit lines using two driver digit lines in the previous example.

Additionally, the reference voltage of the reference digit lines coupled to the first set of sense amplifiers 110 can be set by developing a charge on all seven driver digit lines coupled to the second set of sense amplifiers 120 and then sharing the developed charge with the reference digit lines. This can be accomplished by switching both the PSA120A and PSA120B signals LOW between the times T0 and T2 and switching both the SHR102(2)A and SHR102(2)B signals HIGH between the times T3 and T4. The previous example also described a sequence of events that included driving a select number of driver digit lines to the voltage supply level, fully driving the WL to the wordline voltage, and charge sharing to establish the reference voltage. In alternative embodiments, the sequence of events is modified from that previously described, and also includes events occurring concurrently. For example, the WL transition and charge sharing in the target array can happen concurrently with driving the driver digit lines to the voltage supply level.

As illustrated by the previous examples, the reference voltage that is set for the reference digit lines during a precharge operation can be adjusted by selecting different sets of driver digit lines to drive to a voltage supply voltage level and coupling with the reference digits. Although FIG. 1 illustrates each set of sense amplifiers 110, 120 having only seven total sense amplifiers and two sub-groups of sense amplifiers (one having two sense amplifiers and the other having five sense amplifiers) the number of total sense amplifiers for a set of sense amplifiers, and the number of sub-groups as well as the number of sense amplifiers in the sub-groups, can be modified without departing from the scope of the present invention. The embodiment shown in FIG. 1 has been provided by way of example, and consequently, should not be viewed as limiting the present invention to any particular embodiment.

In one embodiment, the group (i.e., number) of driver digit lines that are coupled to reference digit lines as part of the precharge operation is selected and set at testing. The memory devices are evaluated under various operating conditions during testing, and driver digit line grouping providing the most desirable results are selected for normal use of the memory device. The selection can be programmed using conventional designs, for example, by programming anti-fuses or fuses. In an alternative embodiment, the driver digit line grouping can be changed to accommodate PVT variations during normal use. In an embodiment that is included with a memory device having a temperature sensor, temperature related feedback information can be used to change from one driver digit line grouping to another in order to account for variations in operating temperature. In an another embodiment, the driver digit line grouping can be selectable through the use of a mode register or the like. It will be appreciated by those ordinarily skilled in the art that the particular manner for selecting the driver digit line grouping should not be interpreted as limiting the scope of the present invention.

Although the previous embodiment has been discussed with respect to a grounded digit line precharge scheme, in an alternative embodiment, the digit lines are precharged to a voltage supply voltage level, and are then reduced by a non-zero voltage to establish a reference voltage. The non-zero voltage by which the precharged digit lines are reduced can be generated by coupling a group of grounded digit lines to the reference digit lines through a common reference line. The magnitude of voltage by which the reference digit lines are reduced can be adjusted by coupling groups of grounded digit lines having greater or lesser number of grounded digit lines. Those ordinarily skilled in the art will have sufficient understanding to modify the specific embodiments described herein to have such a voltage supply voltage level digit line precharge scheme.

Figure 4:
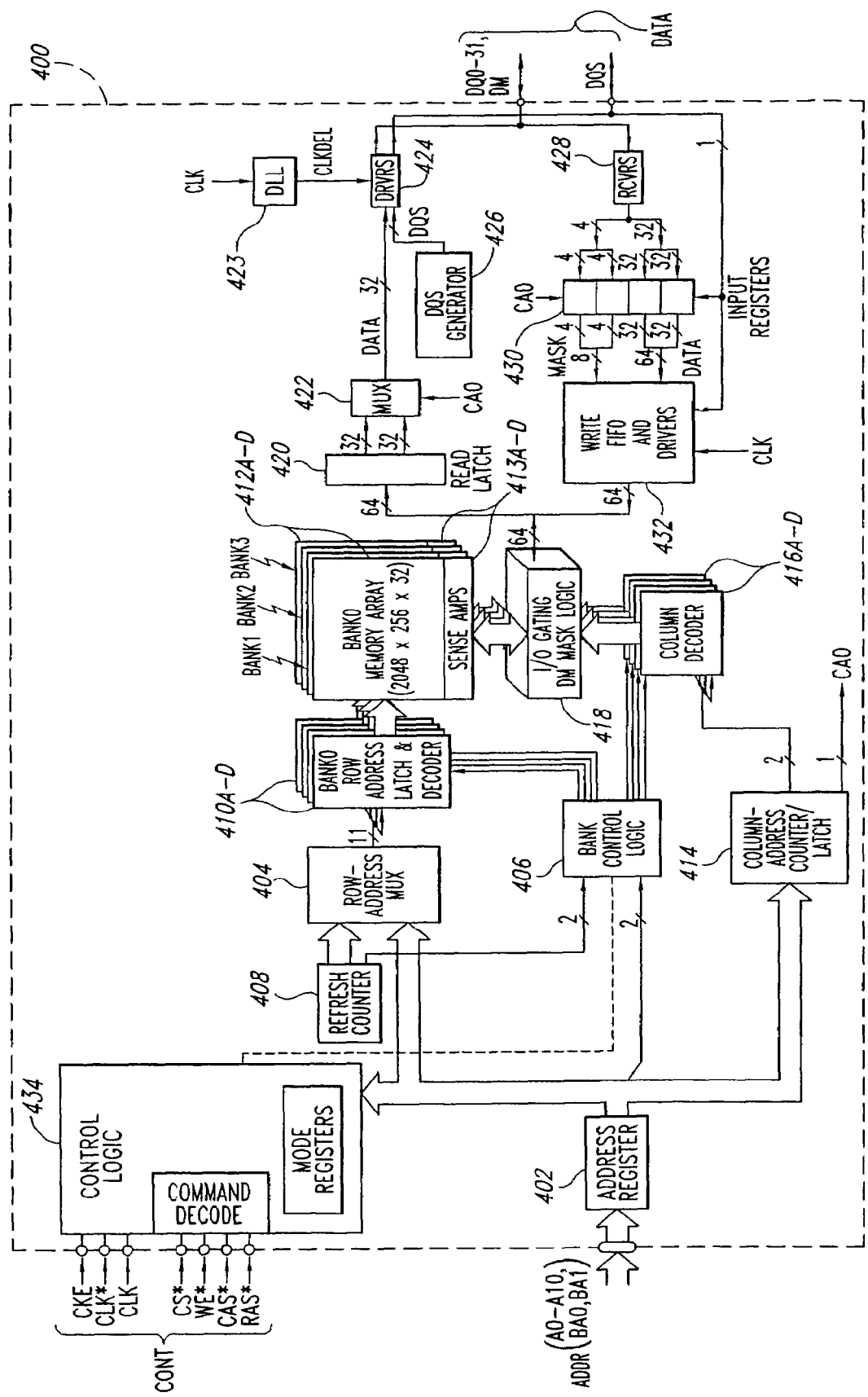
FIG. 4 is a functional block diagram illustrating a memory device including an open digit line array architecture according to an embodiment of the present invention.

FIG. 4 is a functional block diagram of a memory device 400 including an open digit line array architecture according to an embodiment of the present invention. The memory device 400 in FIG. 4 is a double-data rate ("DDR") synchronous dynamic random access memory ("SDRAM"), although the principles described herein are applicable to any memory device that may include a delay-locked loop for synchronizing internal and external signals, such as conventional synchronous DRAMs ("SDRAMs"), as well as packetized memory devices like SLDRAMs and RDRAMs, and are equally applicable to any integrated circuit that must synchronize internal and external clocking signals.

The memory device 400 includes an address register 402 that receives row, column, and bank addresses over an address bus ADDR, with a memory controller (not shown) typically supplying the addresses. The address register 402 receives a row address and a bank address that are applied to a row address multiplexer 404 and bank control logic circuit 406, respectively. The row address multiplexer 404 applies either the row address received from the address register 402 or a refresh row address from a refresh counter 408 to a plurality of row address latch and decoders 410A–D. The bank control logic 406 activates the row address latch and decoder 410A–D corresponding to either the bank address received from the address register 402 or a refresh bank address from the refresh counter 408, and the activated row address latch and decoder latches and decodes the received row address. In response to the decoded row address, the activated row address latch and decoder 410A–D applies various signals to a corresponding memory bank 412A–D to thereby activate a row of memory cells corresponding to the decoded row address. Each memory bank 412A–D includes a memory-cell array having a plurality of memory cells arranged in rows and columns, and the data stored in the memory cells in the activated row is sensed and latched by sense amplifiers 413A–D in the corresponding memory bank. The memory banks 412A–D and sense amplifiers 413A–D of the memory device 100 utilize an open digit array architecture according to an embodiment of the present invention. The row address multiplexer 404 applies the refresh row address from the refresh counter 408 to the decoders 410A–D and the bank control logic circuit 406 uses the refresh bank address from the refresh counter when the memory device 400 operates in an auto-refresh or self-refresh mode of operation in response to an auto- or self-refresh command being applied to the memory device 400, as will be appreciated by those skilled in the art.

A column address is applied on the ADDR bus after the row and bank addresses, and the address register 402 applies the column address to a column address counter and latch 414 which, in turn, latches the column address and applies the latched column address to a plurality of column decoders 416A–D. The bank control logic 406 activates the column decoder 416A–D corresponding to the received bank address, and the activated column decoder decodes the applied column address. Depending on the operating mode of the memory device 400, the column address counter and latch 414 either directly applies the latched column address to the decoders 416A–D, or applies a sequence of column addresses to the decoders starting at the column address provided by the address register 402. In response to the column address from the counter and latch 414, the activated column decoder 416A–D applies decode and control signals to an I/O gating and data masking circuit 418 which, in turn, accesses memory cells corresponding to the decoded column address in the activated row of memory cells in the memory bank 412A–D being accessed.

During data read operations, data being read from the addressed memory cells is coupled through the I/O gating and data masking circuit 418 to a read latch 420. The I/O gating and data masking circuit 418 supplies N bits of data to the read latch 420, which then applies two N/2 bit words to a multiplexer 422. In the embodiment of FIG. 4, the circuit 418 provides 64 bits to the read latch 420 which, in turn, provides two 32 bits words to the multiplexer 422. A data driver 424 sequentially receives the N/2 bit words from the multiplexer 422 and also receives a data strobe signal DQS from a strobe signal generator 426 and a delayed clock signal CLKDEL from the delay-locked loop 423. The DQS signal is used by an external circuit such as a memory controller (not shown) in latching data from the memory device 400 during read operations. In response to the delayed clock signal CLKDEL, the data driver 424 sequentially outputs the received N/2 bits words as a corresponding data word DQ. The data driver 424 also outputs the data strobe signal DQS having rising and falling edges in synchronism with rising and falling edges of the CLK signal, respectively. Each data word DQ and the data strobe signal DQS collectively define a data bus DATA. The DATA bus also includes masking signals DM0–M, which will be described in more detail below with reference to data write operations.

During data write operations, an external circuit such as a memory controller (not shown) applies N/2 bit data words DQ, the strobe signal DQS, and corresponding data masking signals DM on the data bus DATA. A data receiver 428 receives each DQ word and the associated DM signals, and applies these signals to input registers 430 that are clocked by the DQS signal. In response to a rising edge of the DQS signal, the input registers 430 latch a first N/2 bit DQ word and the associated DM signals, and in response to a falling edge of the DQS signal the input registers latch the second N/2 bit DQ word and associated DM signals. The input register 430 provides the two latched N/2 bit DQ words as an N-bit word to a write FIFO and driver 432, which clocks the applied DQ word and DM signals into the write FIFO and driver in response to the DQS signal. The DQ word is clocked out of the write FIFO and driver 432 in response to the CLK signal, and is applied to the I/O gating and masking circuit 418. The I/O gating and masking circuit 418 transfers the DQ word to the addressed memory cells in the accessed bank 412A–D subject to the DM signals, which may be used to selectively mask bits or groups of bits in the DQ words (i.e., in the write data) being written to the addressed memory cells.

A control logic and command decoder 434 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 434 latches and decodes an applied command, and generates a sequence of clocking and control signals that control the components 402–432 to execute the function of the applied command. The clock enable signal CKE enables clocking of the command decoder 434 by the clock signals CLK, CLK*. The command decoder 434 latches command and address signals at positive edges of the CLK, CLK* signals (i.e., the crossing point of CLK going high and CLK* going low), while the input registers 430 and data drivers 424 transfer data into and from, respectively, the memory device 400 in response to both edges of the data strobe signal DQS and thus at double the frequency of the clock signals CLK, CLK*. This is true because the DQS signal has the same frequency as the CLK, CLK* signals. The memory device 400 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 434 in generating the control and timing signals is conventional, and thus, for the sake of brevity, will not be described in more detail.

Figure 5:
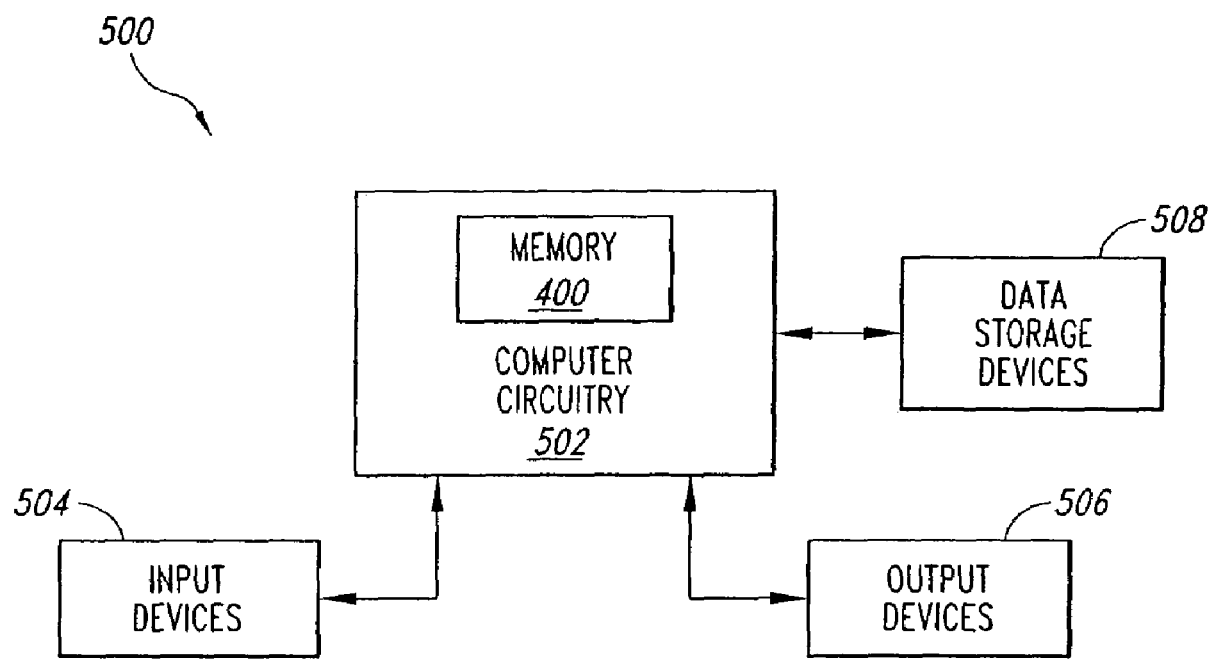
FIG. 5 is a functional block diagram illustrating a computer processing system including the memory device of FIG. 4.

FIG. 5 is a block diagram of a computer system 500 including computer circuitry 502 including the memory device 400 of FIG. 4. Typically, the computer circuitry 502 is coupled through address, data, and control buses to the memory device 400 to provide for writing data to and reading data from the memory device. The computer circuitry 502 includes circuitry for performing various computing functions, such as executing specific software to perform specific calculations or tasks. In addition, the computer system 500 includes one or more input devices 504, such as a keyboard or a mouse, coupled to the computer circuitry 502 to allow an operator to interface with the computer system. Typically, the computer system 500 also includes one or more output devices 506 coupled to the computer circuitry 502, such as output devices typically including a printer and a video terminal. One or more data storage devices 508 are also typically coupled to the computer circuitry 502 to store data or retrieve data from external storage media (not shown). Examples of typical storage devices 508 include hard and floppy disks, tape cassettes, compact disk read-only ("CD-ROMs") and compact disk read-write ("CD-RW") memories, and digital video disks ("DVDs").

From the foregoing it will be appreciated that, although specific embodiments of the invention have been described herein for purposes of illustration, various modifications may be made without deviating from the spirit and scope of the invention. Such modifications are well within the skill of those ordinarily skilled in the art. Accordingly, the invention is not limited except as by the appended claims.

What is claimed is:

1. An open digit line array architecture, comprising:
a first plurality of sense of amplifiers, each sense amplifier of the first plurality coupled to a first digit line of a first memory sub-array and a second digit line of a second memory sub-array;
a second plurality of sense amplifiers, each sense amplifier of the second plurality coupled to a first digit line of the first memory sub-array and a second digit line of a third memory sub-array;
a common reference line;
a first voltage supply line coupled to the sense amplifiers of a first group of sense amplifiers of the second plurality of sense amplifiers;
a first voltage supply switch having a first node coupled to the first voltage supply line and a second node, the first voltage supply switch configured to couple the first voltage supply line to a voltage applied to the second node;
a second voltage supply line coupled to the sense amplifiers of a second group of sense amplifiers of the second plurality of sense amplifiers;
a second voltage supply switch having a first node coupled to the second voltage supply line and a second node, the second voltage supply switch configured to couple the second voltage supply line to a voltage applied to the second node
a first plurality of switches coupled to a respective first digit line of the pair of digit lines coupled to the first plurality of sense amplifiers and further coupled to the common reference line, each switch configured to selectively couple the respective first digit line to the common reference line; and
a second plurality of switches coupled to a respective one of the first digit lines of the first group of sense amplifiers of the second plurality of sense amplifiers and the common reference line, the second plurality of switches configured to selectively couple the respective first digit lines to the common reference line; and
a third plurality of switches coupled to a respective one of the first digit lines of the second group of sense amplifiers of the second plurality of sense amplifiers and the common reference line, the second plurality of switches configured to selectively couple the respective first digit lines to the common reference line.

2. The open digit line array architecture of claim 1 wherein each sense amplifier of the second plurality of sense amplifiers comprises:
a latch having a first input node coupled to the first digit line of the pair of digit lines and a second input node coupled to a second digit line of the pair of digit lines, the latch further having a supply node coupled to a respective voltage supply line and further having a ground node;
a precharge switch having a first node coupled to the first and second digit lines of the pair of digit lines and a second node coupled to a precharge level, the precharge switch further having a control node and configured to coupled the first node to the second node in response to a precharge control signal applied to the control node;
a first charging switch having a first node coupled to the supply node of the latch and a second node coupled to the first digit line of the pair of digit lines, the first charging switch further having a control node and configured to coupled the first node to the second node in response to a first charge control signal applied to the control node; and
a second charging switch having a first node coupled to the supply node of the latch and a second node coupled to the second digit line of the pair of digit lines, the second charging switch further having a control node and configured to coupled the first node to the second node in response to a second charge control signal applied to the control node.

3. The open digit line array architecture of claim 2 wherein the precharge level comprises ground.

4. The open digit line array architecture of claim 2 wherein the precharge level comprises a supply voltage.

5. The open digit line array architecture of claim 1 wherein the first group of sense amplifiers comprises N sense amplifiers and the second group of sense amplifiers comprises M sense amplifiers, N and M are unequal.

6. A memory device, comprising:
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit, the memory-cell array having an open digit line array architecture, the open digit line array architecture, comprising:
a first plurality of sense of amplifiers, each sense amplifier of the first plurality coupled to a first digit line of a first memory sub-array and a second digit line of a second memory sub-array;

a second plurality of sense amplifiers, each sense amplifier of the second plurality coupled to a first digit line of the first memory sub-array and a second digit line of a third memory sub-array;

a common reference line;

a first voltage supply line coupled to the sense amplifiers of a first group of sense amplifiers of the second plurality of sense amplifiers;

a first voltage supply switch having a first node coupled to the first voltage supply line and a second node, the first voltage supply switch configured to couple the first voltage supply line to a voltage applied to the second node;

a second voltage supply line coupled to the sense amplifiers of a second group of sense amplifiers of the second plurality of sense amplifiers;

a second voltage supply switch having a first node coupled to the second voltage supply line and a second node, the second voltage supply switch configured to couple the second voltage supply line to a voltage applied to the second node a first plurality of switches coupled to a respective first digit line of the pair of digit lines coupled to the first plurality of sense amplifiers and further coupled to the common reference line, each switch configured to selectively couple the respective first digit line to the common reference line; and a second plurality of switches coupled to a respective one of the first digit lines of the first group of sense amplifiers of the second plurality of sense amplifiers and the common reference line, the second plurality of switches configured to selectively couple the respective first digit lines to the common reference line; and a third plurality of switches coupled to a respective one of the first digit lines of the second group of sense amplifiers of the second plurality of sense amplifiers and the common reference line, the second plurality of switches configured to selectively couple the respective first digit lines to the common reference line.

7. The memory device of claim 6 wherein each sense amplifier of the second plurality of sense amplifiers comprises:

a latch having a first input node coupled to the first digit line of the pair of digit lines and a second input node coupled to a second digit line of the pair of digit lines, the latch further having a supply node coupled to a respective voltage supply line and further having a ground node;

a precharge switch having a first node coupled to the first and second digit lines of the pair of digit lines and a second node coupled to a precharge level, the precharge switch further having a control node and configured to coupled the first node to the second node in response to a precharge control signal applied to the control node;

a first charging switch having a first node coupled to the supply node of the latch and a second node coupled to the first digit line of the pair of digit lines, the first charging switch further having a control node and configured to coupled the first node to the second node in response to a first charge control signal applied to the control node; and a second charging switch having a first node coupled to the supply node of the latch and a second node coupled to the second digit line of the pair of digit lines, the second charging switch further having a control node and configured to coupled the first node to the second node in response to a second charge control signal applied to the control node.

8. The memory device of claim 7 wherein the precharge level comprises ground.

9. The memory device of claim 7 wherein the precharge level comprises a supply voltage.

10. The memory device of claim 6 wherein the first group of sense amplifiers comprises N sense amplifiers and the second group of sense amplifiers comprises M sense amplifiers, N and M are unequal.

11. A computer processing system, comprising:

a data input device;

a data output device;

a processor coupled to the data input and output devices; and a memory device, comprising:
   an address bus;
   a control bus;
   a data bus;
   an address decoder coupled to the address bus;
   a read/write circuit coupled to the data bus;
   a control circuit coupled to the control bus; and
   a memory-cell array coupled to the address decoder, control circuit, and read/write circuit, the memory-cell array having an open digit line array architecture, the open digit line array architecture, comprising:
      a first plurality of sense of amplifiers, each sense amplifier of the first plurality coupled to a first digit line of a first memory sub-array and a second digit line of a second memory sub-array;
      a second plurality of sense amplifiers, each sense amplifier of the second plurality coupled to a first digit line of the first memory sub-array and a second digit line of a third memory sub-array;
      a common reference line;
      a first voltage supply line coupled to the sense amplifiers of a first group of sense amplifiers of the second plurality of sense amplifiers;
      a first voltage supply switch having a first node coupled to the first voltage supply line and a second node, the first voltage supply switch configured to couple the first voltage supply line to a voltage applied to the second node;
      a second voltage supply line coupled to the sense amplifiers of a second group of sense amplifiers of the second plurality of sense amplifiers;
      a second voltage supply switch having a first node coupled to the second voltage supply line and a second node, the second voltage supply switch configured to couple the second voltage supply line to a voltage applied to the second node
      a first plurality of switches coupled to a respective first digit line of the pair of digit lines coupled to the first plurality of sense amplifiers and further coupled to the common reference line, each switch configured to selectively couple the respective first digit line to the common reference line; and
      a second plurality of switches coupled to a respective one of the first digit lines of the first group of sense amplifiers of the second plurality of sense amplifiers and the common reference line, the second plurality of switches configured to selectively couple the respective first digit lines to the common reference line; and a third plurality of switches coupled to a respective one of the first digit lines of the second group of sense amplifiers of the second plurality of sense amplifiers and the common reference line, the second plurality of switches configured to selectively couple the respective first digit lines to the common reference line.

12. The computer processing system of claim 11 wherein each sense amplifier of the second plurality of sense amplifiers comprises:

a latch having a first input node coupled to the first digit line of the pair of digit lines and a second input node coupled to a second digit line of the pair of digit lines, the latch further having a supply node coupled to a respective voltage supply line and further having a ground node;

a precharge switch having a first node coupled to the first and second digit lines of the pair of digit lines and a second node coupled to a precharge level, the precharge switch further having a control node and configured to coupled the first node to the second node in response to a precharge control signal applied to the control node;

a first charging switch having a first node coupled to the supply node of the latch and a second node coupled to the first digit line of the pair of digit lines, the first charging switch further having a control node and configured to coupled the first node to the second node in response to a first charge control signal applied to the control node; and a second charging switch having a first node coupled to the supply node of the latch and a second node coupled to the second digit line of the pair of digit lines, the second charging switch further having a control node and configured to coupled the first node to the second node in response to a second charge control signal applied to the control node.

13. The computer processing system of claim 12 wherein the precharge level comprises ground.

14. The computer processing system of claim 12 wherein the precharge level comprises a supply voltage.

15. The computer processing system of claim 11 wherein the first group of sense amplifiers comprises N sense amplifiers and the second group of sense amplifiers comprises M sense amplifiers, N and M are unequal.

* * * * *